United States Patent
Falcon

(10) Patent No.: US 9,925,759 B2
(45) Date of Patent: Mar. 27, 2018

(54) MULTI-LAYER PRINTING SCREEN HAVING A PLURALITY OF BRIDGES AT SPACED INTERVALS

(75) Inventor: Tom Falcon, Weymouth (GB)

(73) Assignee: ASM Assembly Systems Switzerland GmbH, Zurich (CH)

( * ) Notice: Subject to any disclaimer, the term of this patent is extended or adjusted under 35 U.S.C. 154(b) by 178 days.

(21) Appl. No.: 13/426,484

(22) Filed: Mar. 21, 2012

(65) Prior Publication Data

US 2013/0032048 A1    Feb. 7, 2013

Related U.S. Application Data

(63) Continuation of application No. PCT/GB2010/001775, filed on Sep. 21, 2010.

(30) Foreign Application Priority Data

Sep. 21, 2009    (GB) .................................. 0916614.1
Sep. 21, 2009    (GB) .................................. 0916617.4

(51) Int. Cl.
  *B41N 1/24*    (2006.01)
  *B41F 15/36*   (2006.01)
  *H05K 3/12*    (2006.01)

(52) U.S. Cl.
  CPC .............. *B41F 15/36* (2013.01); *B41N 1/248* (2013.01); *H05K 3/1225* (2013.01)

(58) Field of Classification Search
  CPC ........ B41F 15/0818; B41F 15/36; B41N 1/24; B41N 1/243; B41N 1/247; B41N 1/248;
  (Continued)

(56) References Cited

U.S. PATENT DOCUMENTS 3,668,028 A  *  6/1972   Short .............................. 216/12
5,359,928 A     11/1994  Blessington et al.
(Continued)

FOREIGN PATENT DOCUMENTS

CN    201020914 Y    2/2008
DE      1960723 A    6/1971
(Continued)

OTHER PUBLICATIONS

Partial English language translation of JP2008-162277A, publication date Jul. 17, 2008.*

(Continued)

*Primary Examiner* — Leslie J Evanisko
(74) *Attorney, Agent, or Firm* — Renner, Otto, Boisselle & Sklar, LLP

(57) ABSTRACT

A printing screen for and method of printing elongate structures on substrates (S), the printing screen comprising first and second layers (3, 5) of different material, the first layer (3) providing a surface over which a printing element is in use traversed and including a plurality of elongate first printing apertures (7) across which extend a plurality of bridges (9) at spaced intervals, and the second layer (5) in use overlying the substrate (S) and including a plurality of elongate second printing apertures (15) through which printing medium is in use printed onto the underlying substrate (S), each of the second printing (15) apertures being located in registration with respective ones of the first printing apertures (7) in the first layer (3).

23 Claims, 12 Drawing Sheets

(58) Field of Classification Search
CPC .. B41M 1/12; B41C 1/14; H05K 3/12; H05K 3/1216; H05K 3/1225; B41P 2200/40; B41P 2215/12
USPC .......................................................... 101/127
IPC .......................................................... B41N 1/24
See application file for complete search history.

(56) References Cited

U.S. PATENT DOCUMENTS

| | | | |
|---|---|---|---|
| 5,361,695 | A | 11/1994 | Takagi et al. |
| 6,183,839 | B1 | 2/2001 | Bourrieres |
| 2008/0060536 | A1* | 3/2008 | Holda ................. B41C 1/142 101/128.4 |
| 2009/0288566 | A1 | 11/2009 | Maihoefer et al. |
| 2011/0259218 | A1 | 10/2011 | Becker et al. |
| 2012/0246518 | A1 | 9/2012 | Francis et al. |

FOREIGN PATENT DOCUMENTS

| | | |
|---|---|---|
| DE | 3227434 A | 1/1984 |
| DE | 202005007549 U | 8/2005 |
| DE | 202008004821 U | 7/2008 |
| DE | 202008012829 U | 1/2009 |
| DE | 202010007774 U | 9/2010 |
| EP | 0985545 A | 3/2000 |
| EP | 1577116 A | 9/2005 |
| EP | 1892116 A | 2/2008 |
| GB | 2201637 A * | 9/1988 |
| GB | 2205440 A | 12/1988 |
| GB | 2295166 A | 5/1996 |
| GB | 2307446 A | 5/1997 |
| JP | 04/197685 A | 7/1992 |
| JP | 05/201164 A | 8/1993 |
| JP | 05/229091 A | 9/1993 |
| JP | 06/143855 A | 5/1994 |
| JP | 09/315026 A | 5/1996 |
| JP | H 10/286936 A | 10/1998 |
| JP | 2000/168256 A | 12/1998 |
| JP | 11-11033 A | 1/1999 |
| JP | 2000/334909 A | 6/1999 |
| JP | 2001/113667 A | 4/2001 |
| JP | 2001277745 A * | 10/2001 |
| JP | 2006341547 A * | 12/2006 |
| JP | 2008/078571 A | 4/2008 |
| JP | 2008162277 A * | 7/2008 |
| JP | 2008/221697 A | 9/2008 |
| WO | 1996/001743 | 1/1996 |
| WO | 2006/062457 | 6/2006 |
| WO | 2007/077235 | 7/2007 |
| WO | 2010/034300 | 4/2010 |

OTHER PUBLICATIONS

Partial English language translation of JP 2006-341547A, publication date Dec. 21, 2006.*

* cited by examiner

| | |
|---|---|
| Mean Width | 67μm |
| Min Width | 65μm |
| Mean Height | 28.9μm |
| Min Height | 25.7μm |
| Mean Aspect Ratio | 0.431 |
| CSAU index | 0.930 |

MULTI-LAYER PRINTING SCREEN HAVING A PLURALITY OF BRIDGES AT SPACED INTERVALS

The present invention relates to printing screens, often alternatively referred to as stencils, in particular for printing narrow, elongate structures on substrates, such as the front side conductors on silicon solar cells, and a method fabricating such printing screens.

BACKGROUND

In silicon photovoltaics, a significant barrier to continued development is the shadowing of the surface of the silicon wafer by the frontside metallisation grid, which will typically block light from reaching about 8% of the wafer. This shadowing loss cannot simply be mitigated by reducing the number of conductors or by spacing the conductors more widely, as this would result in further efficiency losses, primarily due to the increase in resistance across the silicon between the conductors. Although this trade-off between shadowing and resistance seems to leave little room for improvement, the present inventor has recognized that refinements can still be made to give credible efficiency gains.

SUMMARY OF THE INVENTION

It is an aim of the present invention to provide a method of minimising conductor shading losses, by enabling narrower conductor lines, whilst maintaining or improving their cross sectional area uniformity, and therefore their electrical conductivity.

Improving aspect ratio and cross sectional area uniformity together have several advantages, in that narrower, taller conductors will expose more silicon to sunlight, with a resultant increase in efficiency. Another benefit can be had by simply printing more of these conductors on a finer pitch, which will reduce the resistance loss, whilst maintaining the shading loss, again resulting in an efficiency gain. A further benefit is that a high aspect ratio conductor with a uniform cross-sectional area will make the most efficient use of silver, thereby reducing the final 'cost per watt'.

In one aspect the present invention provides a printing screen for printing elongate structures on substrates, the printing screen comprising first and second layers of different material, the first layer providing a surface over which a printing element is in use traversed and including a plurality of elongate first printing apertures across which extend a plurality of bridges at spaced intervals, and the second layer in use overlying a substrate and including a plurality of elongate second printing apertures through which printing medium is in use printed onto the underlying substrate, each of the second printing apertures being located in registration with respective ones of the first printing apertures in the first layer.

In one embodiment the first layer is a metallic layer and the second layer is a non-metallic layer.

In another aspect the present invention provides a printing screen for printing elongate structures on substrates, the printing screen comprising first and second layers, the first, upper layer providing a surface over which a printing element is in use traversed and including a plurality of elongate first printing apertures across which extend a plurality of interconnecting elements at spaced intervals, and the second, lower layer in use overlying a substrate and including a plurality of elongate second printing apertures through which printing medium is in use printed onto the underlying substrate, each of the second printing apertures being located in registration with respective ones of the first printing apertures in the first layer.

In one embodiment the first layer is formed of one of a metallic material or a non-metallic material and the second layer is formed of the other of a metallic material or a non-metallic material.

In another embodiment the first and second layers are both formed of one of a metallic material or a non-metallic material.

In a further aspect the present invention provides a method of fabricating the above-described printing screens.

BRIEF DESCRIPTION OF THE DRAWINGS

Preferred embodiments of the present invention will now be described hereinbelow by way of example only with reference to the accompanying drawings, in which.

DETAILED DESCRIPTION

FIGS. 1 to 5 illustrate a stencil in accordance with a first embodiment of the present invention.

The stencil comprises first and second layers 3, 5, the first, upper layer 3 providing a surface over which a printing element (not illustrated), such as a squeegee, is traversed and the second, lower layer 5 being in contact with an underlying substrate S.

In this embodiment the first layer 3 is a metal layer which is fabricated prior to the application of the second layer 5 thereto.

In this embodiment the first layer 3 is an electroformed layer, here an electroformed nickel layer.

In an alternative embodiment the first layer 3 could be formed from a sheet material, such as a stainless steel sheet, by chemical etching or any other suitable cutting technology.

In this embodiment the second layer 5 is a photo-imageable layer, here formed of a screen emulsion or resist, one example of which being a photopolymer.

In this embodiment the screen emulsion or resist is applied as a wet, liquid film, here by the repeated application of thin films to both sides of the first layer 3, with the film applied to the upper, contact side of the first layer 3 being removed, typically by a squeegee, before curing. In this way, the screen emulsion or resist fills apertures 7, 11 in the first layer 3, which apertures 7, 11 will be described in more detail hereinbelow, with the second layer 5 being held in the apertures 7, 11 by surface tension.

In an alternative embodiment the second layer 5 could be formed from a dry film, such as a dry film resist, which in one embodiment is laminated to the first layer 3.

In this embodiment the substrate S is a silicon solar cell, but it should be understood that the present invention has application to any kind of substrate.

Figure 1:
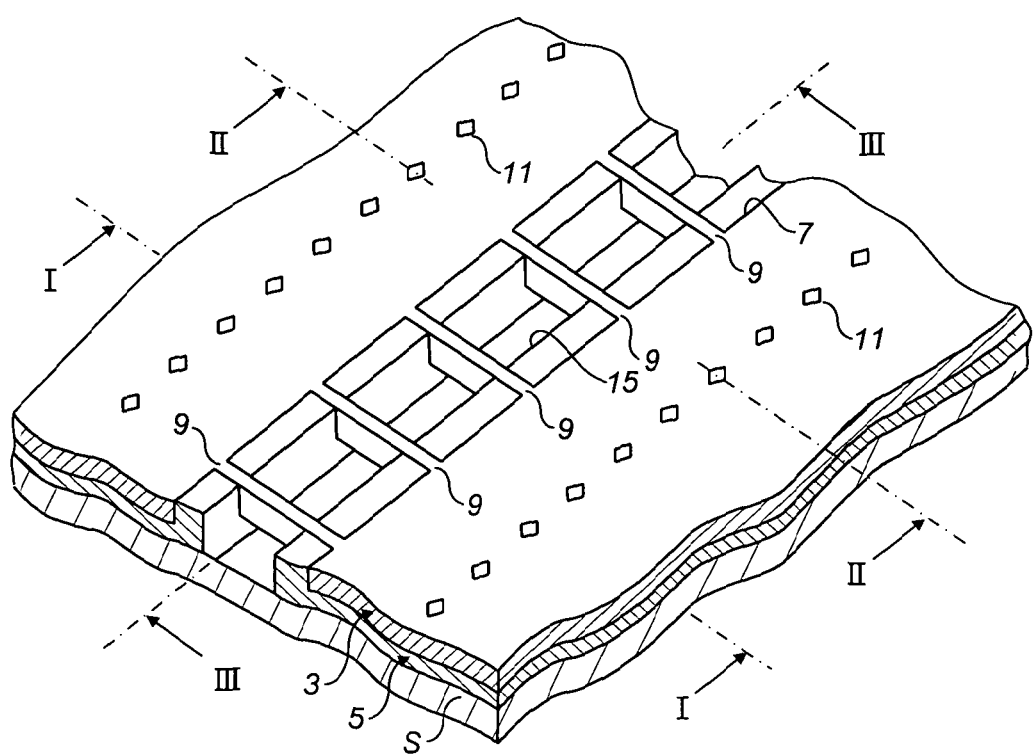
FIG. 1 illustrates a fragmentary perspective view of a stencil in accordance with a first embodiment of the present invention.
Figure 2:
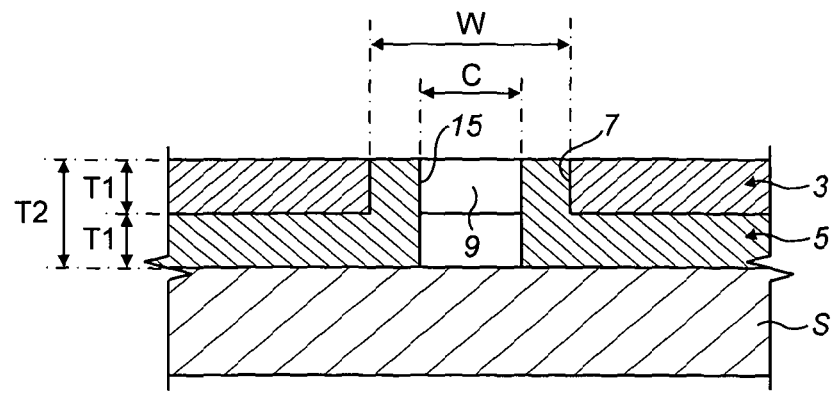
FIG. 2 illustrates a first sectional view (along section I-I) of the stencil of FIG. 1.
Figure 3:
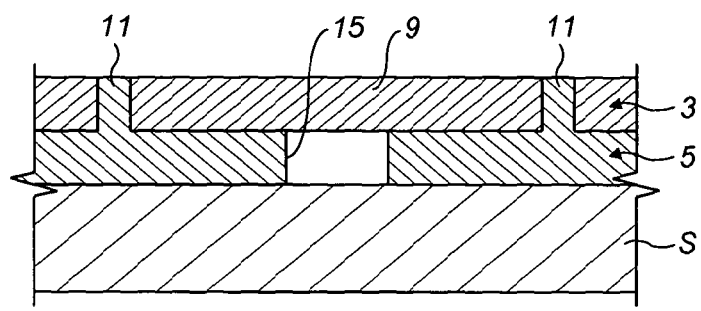
FIG. 3 illustrates a second sectional view (along section II-II) of the stencil of FIG. 1.
Figure 4:
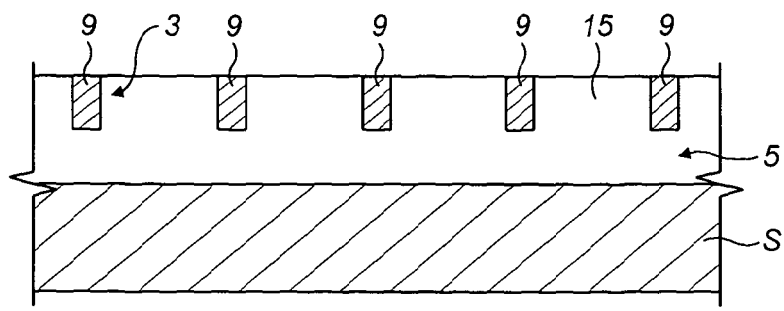
FIG. 4 illustrates a third sectional view (along section III-III) of the stencil of FIG. 1.
Figure 5:
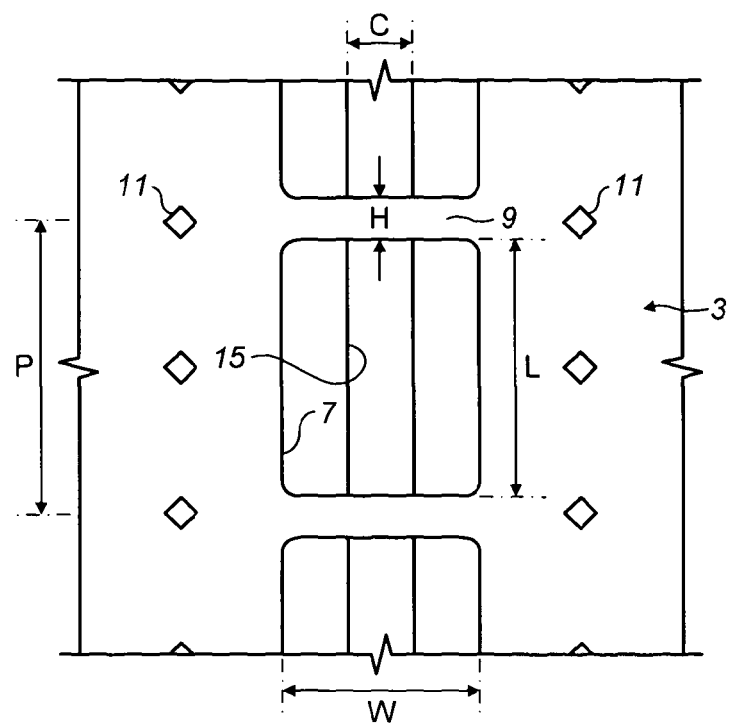
FIG. 5 illustrates a plan view of the stencil of FIG. 1.

The first layer 3 includes a plurality of printing apertures 7, in this embodiment parallel narrow, elongate linear apertures, through which printing medium is delivered in printing onto the underlying substrate S, and across which extend a plurality of bridges 9, as interconnecting elements, at spaced intervals. For ease of illustration, only one printing aperture 7 is illustrated in FIG. 1.

In this embodiment the printing apertures 7 have a width W of about 200 µm.

The bridges 9 act to maintain the integrity of the first layer 3, and in particular the spacing between opposite edges of the respective printing apertures 7, when the stencil is under tension and during movement of a printing element thereover.

In this embodiment the bridges 9 have a width H (in the lengthwise direction of the printing aperture 7) of about 30 µm and a pitch P (in the lengthwise direction of the printing aperture 7) of about 500 µm.

In preferred embodiments the bridges 9 have a width of from about 10 µm to about 60 µm, preferably from about 20 µm to about 50 µm and more preferably from about 20 µm to about 40 µm.

In preferred embodiments the bridges 9 have a pitch P of at least about 150 µm, preferably at least about 250 µm, more preferably at least about 400 µm, and still more preferably at least about 500 µm.

In this embodiment the first layer 3 includes keying apertures 11, here arranged in rows parallel to the printing apertures 7, to which the material of the second layer 5 keys.

In this embodiment the keying apertures 11 have a diamond shape, but it will be understood that the keying apertures 11 could have any suitable shape, such as square, rectangular or circular.

In an alternative embodiment the keying apertures 11 could be omitted.

In one embodiment the lower surface of the first layer 3 could be treated, such as to have a surface roughness, in order to promote bonding of the first and second layers 3, 5.

In another embodiment the lower surface of the first layer 3 could be provided with an intermediate bondcoat, in order to promote bonding of the first and second layers 3, 5.

The second layer 5 includes a plurality of printing apertures 15, here narrow, elongate apertures, through which printing medium is printed onto the underlying substrate S, each located in registration with the printing apertures 7 in the first layer 3.

In this embodiment the printing apertures 15 in the second layer 5 have a width C which is smaller, preferably significantly smaller, than the width W of the printing apertures 7 in the first layer 3, whereby the printing apertures 15 define the width of the elongate structures to be deposited on the substrate S.

In this embodiment the second layer 5 extends to the upper surface of the first layer 3 at the printing apertures 7 therein, such that the printing apertures 15 in the second layer 5 extend the full height of the stencil.

In this embodiment the second layer 5 defines completely the contact surface with the printing medium at the surface of the substrate S, and thereby defines the pattern of deposits to be printed.

In this embodiment the printing apertures 15 have substantially vertical sidewalls.

In this embodiment the printing apertures 15 have a width C of less than about 150 µm. In a preferred embodiment the printing apertures 15 have a width C of less than about 100 µm, preferably less than about 50 µm, and even more preferably less than about 30 µm.

With this configuration, the requirement for precise alignment of the imaging equipment in forming the printing apertures 15 is reduced, as the smaller width C of the printing apertures 15 as compared to the width W of the printing apertures 7 in the first layer 3 provides for significant tolerance in the position at which the printing apertures 15 can be formed relative to the printing apertures 7 in the first layer 3, that is, the printing apertures 15 merely have to be formed within the material of the second layer 5 which is present in the printing apertures 7 of the first layer 3. This compares to configurations where edges of printing apertures have to be aligned exactly.

In this embodiment the printing apertures 15 have an open area of about 94%. The present invention advantageously provides a much greater open area than compared to conventional mesh screens, which typically have an open area of less than 65%.

In preferred embodiments the printing apertures 15 have an open area of at least about 80%, preferably at least about 90% and more preferably at least about 95%.

In this embodiment the first layer 3 and the major part of the second layer 5 each have a thickness T1 of about 30 µm, excepting at the through apertures 7 in the first layer 3, where the second layer 5 extends the full height of the stencil.

In one embodiment the thickness T1 of the main body of the first layer 3 is not less than the thickness T1 of the main body of the second layer 5.

In a preferred embodiment the stencil has a thickness T2 of not more than about 80 µm, more preferably not more than about 60 µm, still more preferably not more than about 50 µm, yet more preferably not more than about 40 µm, and still yet more preferably not more than about 30 µm.

EXAMPLE

The present invention will now be described with reference to the following non-limiting Example.

In this Example, the above-described stencil was prepared with a test pattern including printing apertures 15 having nominal widths of 30, 40, 50, 60, 70 and 80 µm, repeated across the stencil, and with bridges 9 having a nominal width of 35 µm and nominal pitches of 180, 280, 380 and 480 µm.

A silicon solar cell was then printed with a silver paste using the above-described test stencil, and the resulting prints measured using a measuring microscope (Nikon VMR3020 Type 2).

Width and height measurements were each taken at eight measurement sites (excluding intersections) for each printed line type, that is, for each combination of printing aperture width and bridge pitch. Each individual width measurement is the mean width over an 800 µm sampling length. Each individual height measurement is the mean height of the centre of the printed line above the plane of the surrounding silicon surface over a 400 µm sampling length. The height measurements were performed at higher magnification for greater resolution. All measurements were taken on wet paste soon after printing, in order to remove effects associated with drying and firing.

From these measurements, mean aspect ratios and a cross-sectional area uniformity (CSAU) index were determined.

Mean Aspect Ratio=Mean Width/Mean Height

CSAU Index=(Minimum Height/Mean Height+Minimum Width/Mean Width)/2

The CSAU index provides a reliable indication of uniformity, in characterizing a relationship of the minimum height and width to the mean height and width, which is not always provided by the mean aspect ratio. For example, it is quite possible for a measured sample to have an excellent mean aspect ratio but still have low or narrow points, which will exhibit increased electrical resistance. The closer the CSAU index to 1, the closer the minimum height of the printed line is to the mean height.

Figure 6:
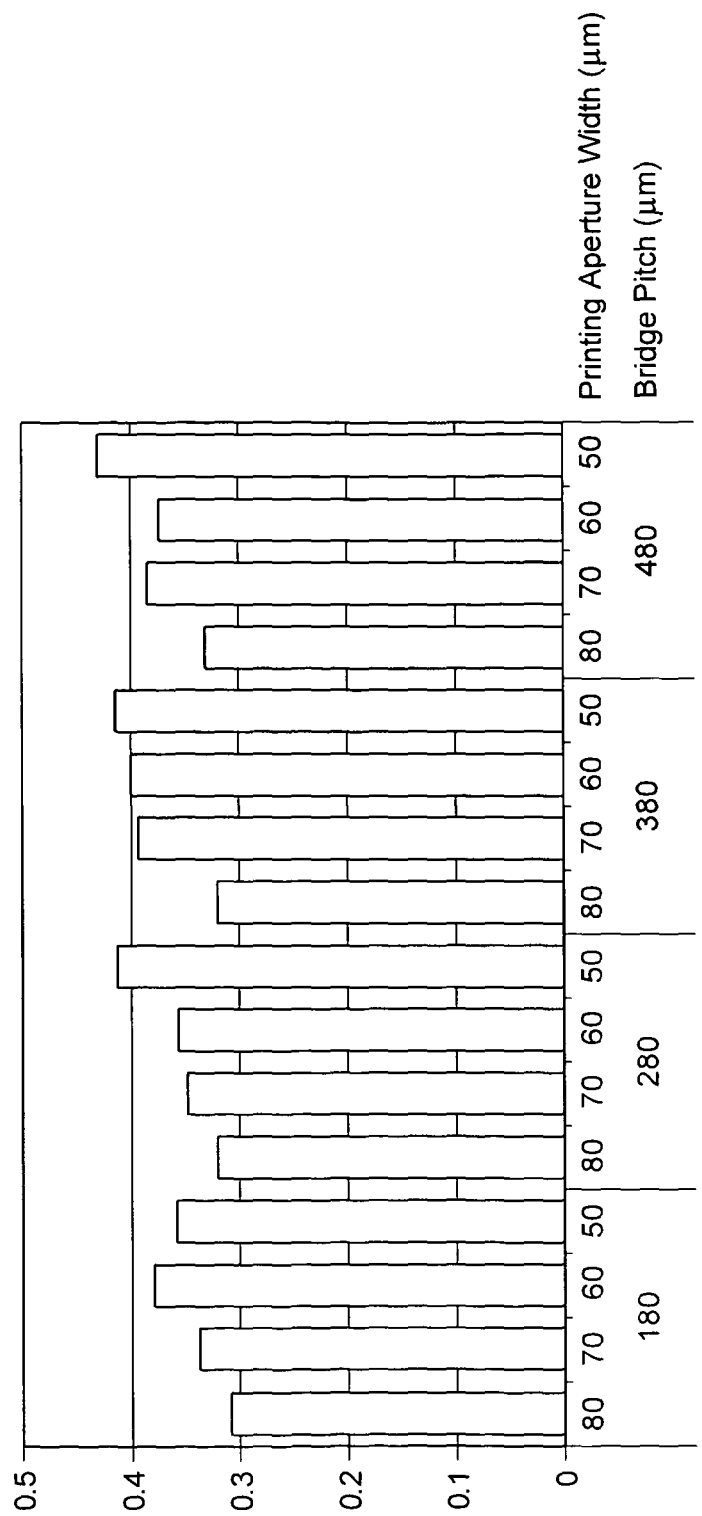
FIG. 6 illustrates the mean aspect ratios of print lines achieved using the test stencil of the Example.

FIG. 6 illustrates the mean aspect ratios achieved using the test stencil of this Example for printing aperture widths of 50, 60, 70 and 80 µm and bridge pitches of 180, 280, 380 and 480 µm.

As will be observed, all of the mean aspect ratios are above 0.3, with the highest at 0.431 for a printing aperture width of 50 µm and a bridge pitch of 480 µm. This compares to measurements determined from conventional mesh screens which exhibited mean aspect ratios of about 0.125, with the highest at 0.147 for a 280 mesh screen with an emulsion thickness of 13 µm and a printing aperture width of 75 µm.

Figure 7:
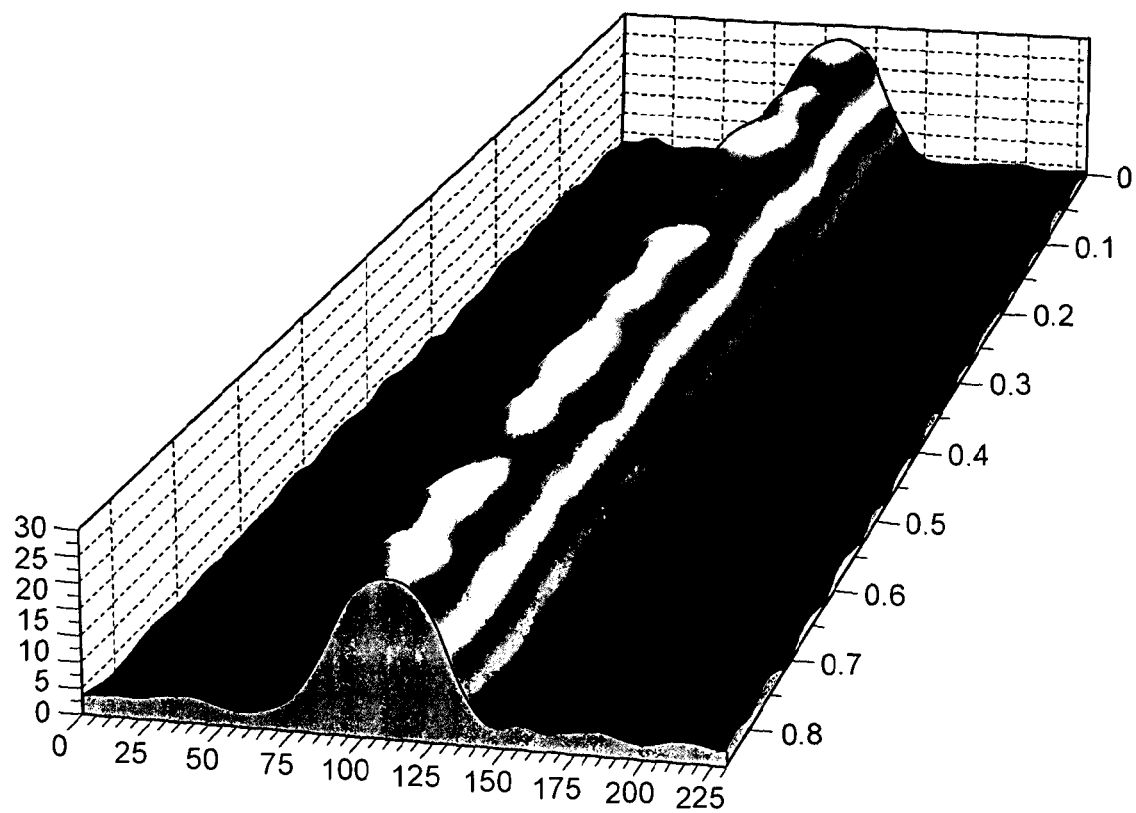
FIG. 7 illustrates a 3D map of one measurement site for the print line with the highest aspect ratio achieved using the test pattern of the Example.

FIG. 7 illustrates a 3D map of one measurement site for the print line with the highest aspect ratio. This print line exhibits a CSAU index of 0.930, which compares to 0.834 for the best performing 280 mesh screen.

By way of comparison, a two-layer metal stencil was fabricated to the same test design, that is, having the same printing aperture widths, bridge widths, bridge pitches and layer thicknesses.

Figure 8:
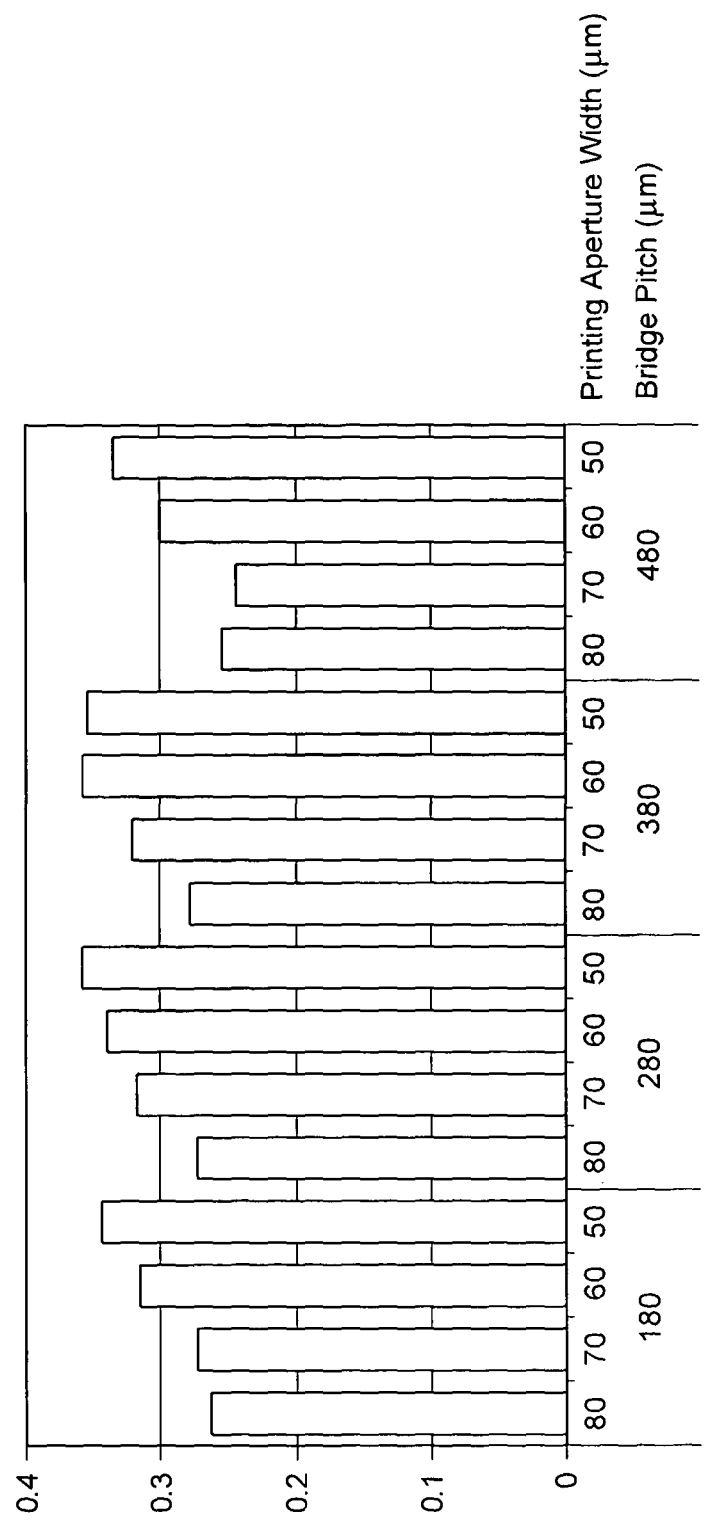
FIG. 8 illustrates the mean aspect ratios of print lines achieved using the comparative stencil of the Example.
Figure 9:
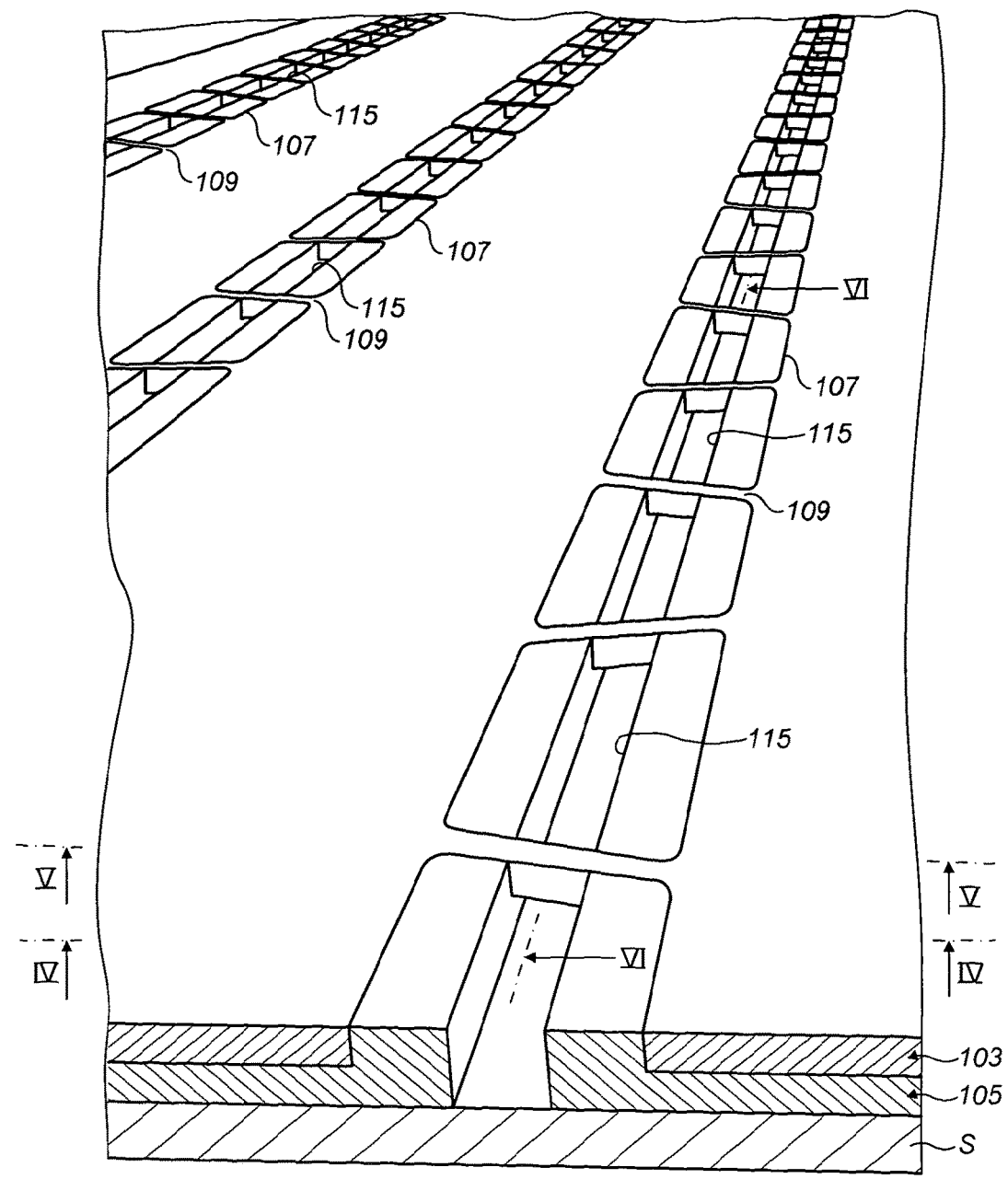
FIG. 9 illustrates a fragmentary perspective view of a stencil in accordance with a second embodiment of the present invention.
Figure 10:
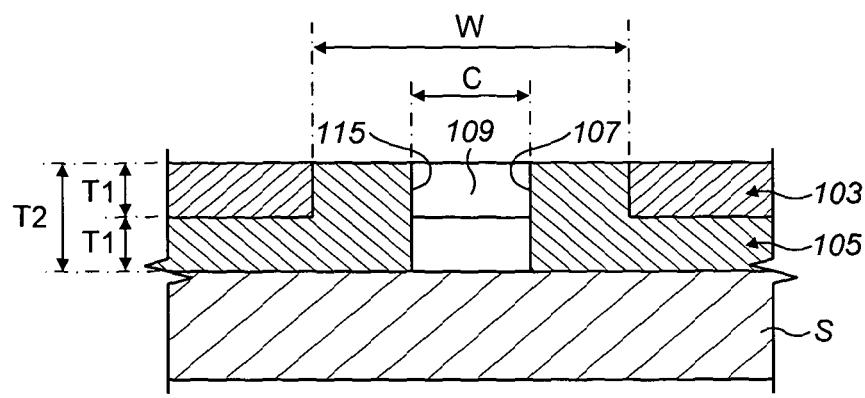
FIG. 10 illustrates a first sectional view (along section IV-IV) of the stencil of FIG. 9.
Figure 11:
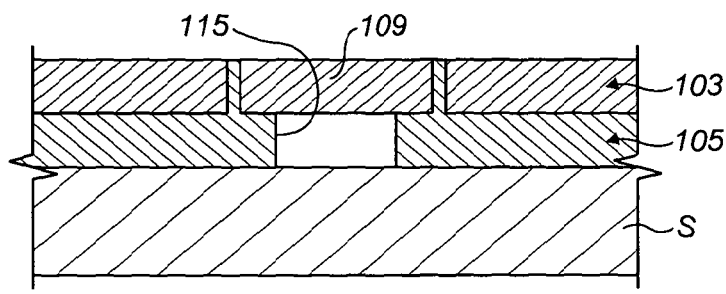
FIG. 11 illustrates a second sectional view (along section V-V) of the stencil of FIG. 9.
Figure 12:
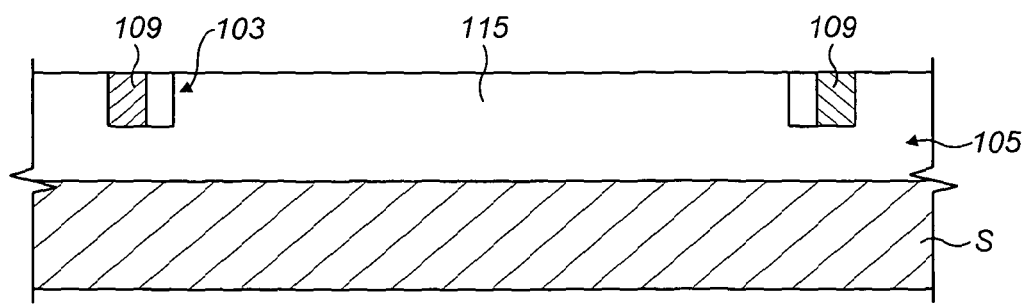
FIG. 12 illustrates a third sectional view (along section VI-VI) of the stencil of FIG. 9.

FIG. 8 illustrates the mean aspect ratios achieved using the comparative metal-metal stencil for printing aperture widths of 50, 60, 70 and 80 µm and bridge pitches of 180, 280, 380 and 480 µm.

As will be observed, the mean aspect ratios obtained using this equivalent, comparative metal-metal stencil are much reduced as compared to the stencil of the present invention.

As will be clearly seen, the stencil of the present invention exhibits markedly improved performance as compared to mesh screens and metal-metal stencils. The present invention not only achieves superior mean aspect ratios, but also exhibits an excellent cross-sectional area uniformity for a narrow printed conductor.

FIGS. 9 to 13 illustrate a stencil in accordance with a second embodiment of the present invention.

The stencil comprises first and second layers 103, 105, the first, upper layer 103 providing a surface over which a printing element (not illustrated), such as a squeegee, is traversed and the second, lower layer 105 being in contact with an underlying substrate S.

In this embodiment the first layer 103 is a metal layer which is fabricated prior to the application of the second layer 105 thereto.

In this embodiment the first layer 103 is formed from a sheet material by chemical etching or any other suitable cutting technology.

In this embodiment the first layer 103 is formed from a stainless steel sheet, here a high-tensile cool-rolled spring steel, such as SS2331 (EN 1.14310).

In an alternative embodiment the first layer 103 could be an electroformed layer, such as an electroformed nickel layer.

In this embodiment the second layer 105 is a photo-imageable layer, here formed of a screen emulsion or resist, one example of which being a photopolymer.

In this embodiment the screen emulsion or resist is applied as a wet, liquid film, here by the repeated application of thin films to both sides of the first layer 103, with the film applied to the upper, contact side of the first layer 103 being removed, typically by a squeegee, before curing. In this way, the screen emulsion or resist fills the printing apertures 107 in the first layer 103, which apertures 107 will be described in more detail hereinbelow, with the first layer 103 being held in the apertures 107 by surface tension.

In an alternative embodiment the second layer 105 could be formed from a dry film, such as a dry film resist, which in one embodiment is laminated to the first layer 103.

In this embodiment the printing apertures 115 are defined in the second layer 105 by exposure of the second layer 105 through a patterned mask, which is aligned relative to the printing apertures 107 in the first layer 103, and the unexposed material is then subsequently removed.

In an alternative embodiment the second layer 105 could be exposed by direct writing thereof, such as with a laser tool, and the unexposed material is then subsequently removed.

In this embodiment the substrate S is a silicon solar cell, but it should be understood that the present invention has application to any kind of substrate.

The first layer 103 includes a plurality of printing apertures 107, in this embodiment parallel narrow, elongate linear apertures, through which printing medium is delivered in printing onto the underlying substrate S, and across which extend a plurality of bridges 109, as interconnecting elements, at spaced intervals.

Figure 13:
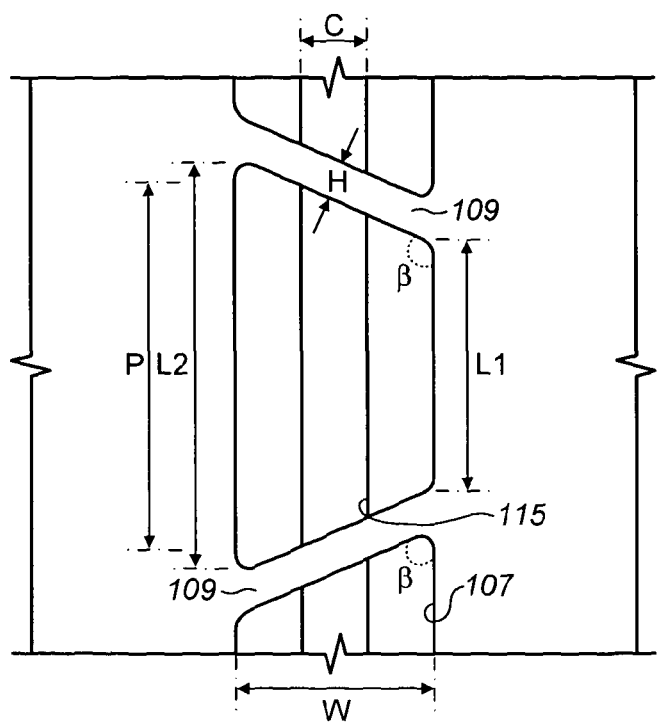
FIG. 13 illustrates a plan view of the stencil of FIG. 9.

In this embodiment, as illustrated clearly in FIG. 13, the bridges 109 are inclined alternately relative to the longitudinal axis of the respective printing aperture 107, such as alternately to enclose repeating acute and obtuse angles β with respect to the longitudinal axis.

In this embodiment the bridges 109 are alternately inclined at an angle β of about 15 degrees relative to the longitudinal axis of the respective printing aperture 107, thus alternately having angles β of 75 and 105 degrees relative to the longitudinal axis.

In preferred embodiments the bridges 109 are alternately inclined at an angle β up to about 30 degrees relative to the longitudinal axis of the respective printing aperture 107, preferably alternately inclined between about 5 degrees and about 30 degrees, more preferably alternately inclined between about 10 degrees and about 20 degrees.

The bridges 109 act to maintain the integrity of the first layer 103, and in particular the spacing between opposite edges of the respective printing apertures 107, when the stencil is under tension and during movement of a printing element thereover.

In this embodiment the printing apertures 107 have a width W of about 180+/−5 µm, a length L1 along the short side thereof of about 363.5+/−5 µm, and a length L2 along the long side thereof of about 460+/−5 µm.

In this embodiment the bridges 109 have a width H (across the length thereof) of about 35+/−5 µm and a mean pitch P (in the lengthwise direction of the printing aperture 107) of about 450 µm.

In a preferred embodiment the bridges 109 have a width H of from about 10 µm to about 60 µm, preferably from about 20 µm to about 50 µm, more preferably from about 20 µm to about 40 µm, and still more preferably from about 20 µm to about 30 µm or from about 30 µm to about 40 µm.

In a preferred embodiment the bridges 109 have a pitch P of at least about 150 µm, preferably at least about 250 µm, more preferably at least about 400 µm, still more preferably at least about 450 µm, and yet still more preferably at least about 500 µm.

In one embodiment the lower surface of the first layer 103 could be treated, such as to have a surface roughness, in order to promote bonding of the first and second layers 103, 105.

In another embodiment the lower surface of the first layer 103 could be provided with an intermediate bondcoat, in order to promote bonding of the first and second layers 103, 105.

In still another embodiment the first layer 103 could include keying apertures, typically arranged in rows parallel to the printing apertures 107, to which the material of the second layer 105 keys.

The second layer 105 includes a plurality of printing apertures 115, here narrow, elongate apertures, through which printing medium is printed onto the underlying substrate S, each located in registration with the printing apertures 107 in the first layer 103.

In this embodiment the printing apertures 115 in the second layer 105 have a width C which is smaller, preferably significantly smaller, than the width W of the printing apertures 107 in the first layer 103, whereby the printing apertures 115 define the width of the elongate structures to be deposited on the substrate S.

In this embodiment the second layer 105 extends to the upper surface of the first layer 103 at the printing apertures 107 therein, such that the printing apertures 115 in the second layer 105 extend the full height of the stencil.

In this embodiment the second layer 105 defines completely the contact surface with the printing medium at the surface of the substrate S, and thereby defines the pattern of deposits to be printed.

In this embodiment the printing apertures 115 have substantially vertical sidewalls.

In this embodiment the printing apertures 115 have a width C of about 60+/−5 µm.

In preferred embodiments the printing apertures 115 have a width C of less than about 150 µm, preferably less than about 100 µm, more preferably less than about 75 µm, still more preferably less than about 60 µm, yet more preferably less than about 50 µm, and even more preferably less than about 30 µm.

With this configuration, the requirement for precise alignment of the imaging equipment in forming the printing apertures 115 is reduced, as the smaller width of the printing apertures 115 as compared to the printing apertures 107 in the first layer 103 provides for significant tolerance in the position at which the printing apertures 115 can be formed relative to the printing apertures 107 in the first layer 103, that is, the printing apertures 115 merely have to be formed within the material of the second layer 105 which is present in the printing apertures 107 of the first layer 103. This compares to configurations where edges of printing apertures have to be aligned exactly.

In this embodiment the printing apertures 115 have an open area of about 93%. The present invention advantageously provides a much greater open area than compared to conventional mesh screens, which typically have an open area of less than 65%.

In a preferred embodiment the printing apertures 115 have an open area of at least about 80%, preferably at least about 90% and more preferably at least about 95%.

In this embodiment the first layer 103 and the major part of the second layer 105 each have a thickness T1 of about 30+/−2 µm, excepting at the through apertures 107 in the first layer 103, where the second layer 105 extends the full height of the stencil.

In one embodiment the thickness T1 of the main body of the first layer 103 is not less than the thickness T1 of the main body of the second layer 105.

In this embodiment the stencil has a thickness T2 of about 60+/−5 µm.

In preferred embodiments the stencil has a thickness T2 of not more than about 80 µm, preferably not more than about 70 µm, more preferably not more than about 60 µm, still more preferably not more than about 50 µm, yet more preferably not more than about 40 µm, and still yet more preferably not more than about 30 µm.

In this embodiment the ratio of the thickness T1 of the main body of the first layer 103 to the thickness T1 of the main body of the second layer 105 is about 1:1.

In preferred embodiments the ratio of the thickness T1 of the main body of the first layer 103 to the thickness T1 of the main body of the second layer 105 is from about 0.8:1 to about 1:0.8, preferably from about 0.9:1 to about 1:0.9.

In this embodiment the ratio of the thickness T2 of the stencil to the width C of the printing apertures 115 is about 1:1.

In preferred embodiments the ratio of the thickness T2 of the stencil to the width C of the printing apertures 115 is from about 0.8:1 to about 1:0.8, preferably from about 0.9:1 to about 1:0.9, preferably greater than 1:1, preferably greater than 1:0.9, preferably greater than 1:0.8.

FIGS. 14 to 18 illustrate a stencil in accordance with a third embodiment of the present invention.

The stencil comprises first and second layers 203, 205, the first, upper layer 203 providing a surface over which a printing element (not illustrated), such as a squeegee, is traversed and the second, lower layer 205 being in contact with an underlying substrate S.

In this embodiment the first layer 203 is a metal layer which is fabricated prior to the application of the second layer 205 thereto.

In this embodiment the first layer 203 is an electroformed layer, here an electroformed nickel layer.

In an alternative embodiment the first layer 203 could be formed from a sheet material by chemical etching or any other suitable cutting technology.

In one embodiment the first layer 203 could be formed from a stainless steel sheet, here a high-tensile cool-rolled spring steel, such as SS2331 (EN 1.14310).

In this embodiment the second layer 205 is a photo-imageable layer, here formed of a screen emulsion or resist, one example of which being a photopolymer.

In this embodiment the screen emulsion or resist is applied as a wet, liquid film, here by the repeated application of thin films to the one, lower side of the first layer 203.

In an alternative embodiment the second layer 205 could be formed from a dry film, such as a dry film resist, which in one embodiment is laminated to the first layer 203.

In this embodiment the printing apertures 215 are defined in the second layer 205 by exposure of the second layer 205 through a patterned mask, which is aligned relative to the printing apertures 207 in the first layer 203, and the unexposed material is then subsequently removed.

In an alternative embodiment the second layer 205 could be exposed by direct writing thereof, such as with a laser tool, and the unexposed material then subsequently removed.

In this embodiment the substrate S is a silicon solar cell, but it should be understood that the present invention has application to any kind of substrate.

Figure 14:
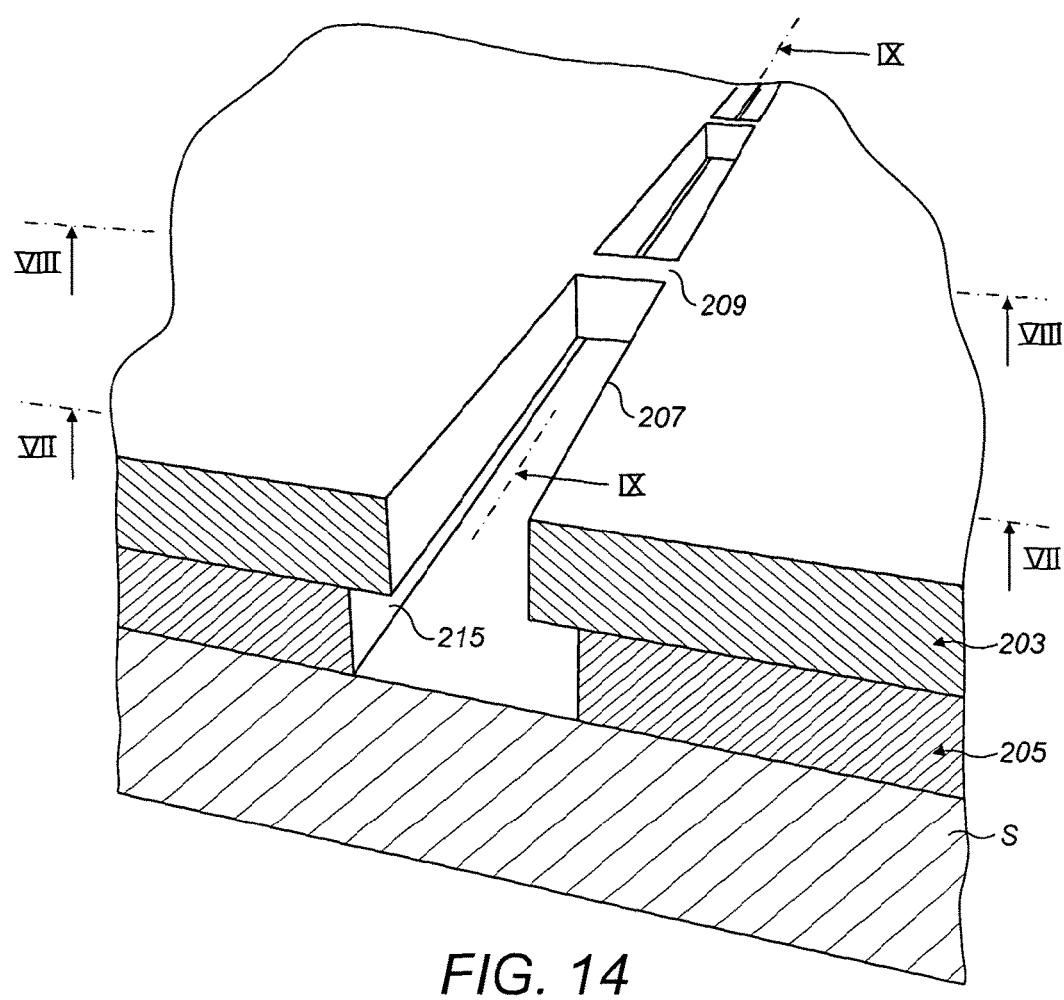
FIG. 14 illustrates a fragmentary perspective view of a stencil in accordance with a third embodiment of the present invention.
Figure 15:
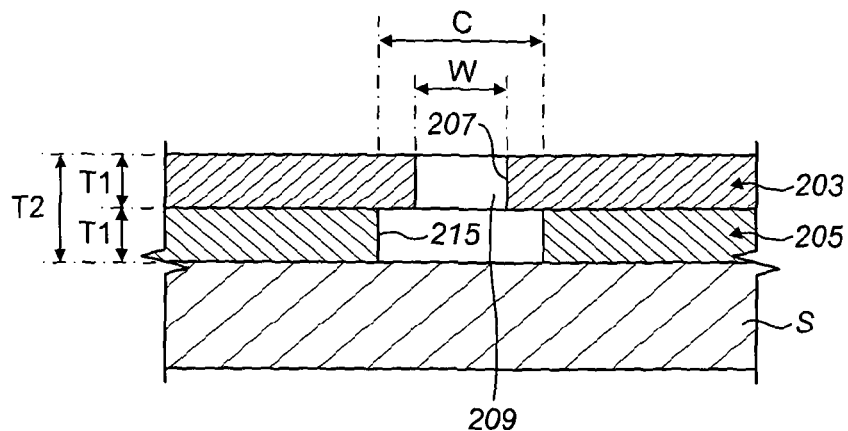
FIG. 15 illustrates a first sectional view (along section VII-VII) of the stencil of FIG. 14.
Figure 16:
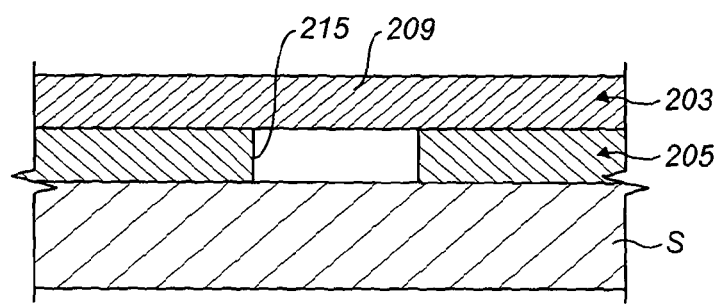
FIG. 16 illustrates a second sectional view (along section VIII-VIII) of the stencil of FIG. 14.
Figure 17:
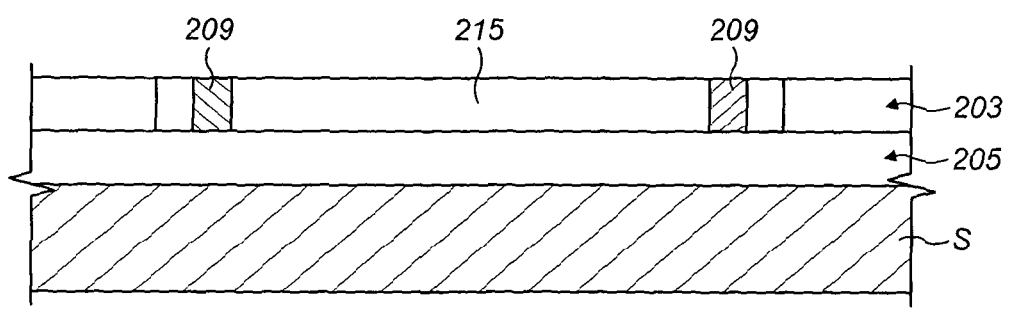
FIG. 17 illustrates a third sectional view (along section IX-IX) of the stencil of FIG. 14.

The first layer 203 includes a plurality of printing apertures 207, in this embodiment parallel narrow, elongate linear apertures, through which printing medium is delivered in printing onto the underlying substrate S, and across which extend a plurality of bridges 209, as interconnecting elements, at spaced intervals. For ease of illustration, only one printing aperture 207 is illustrated in FIG. 14.

Figure 18:
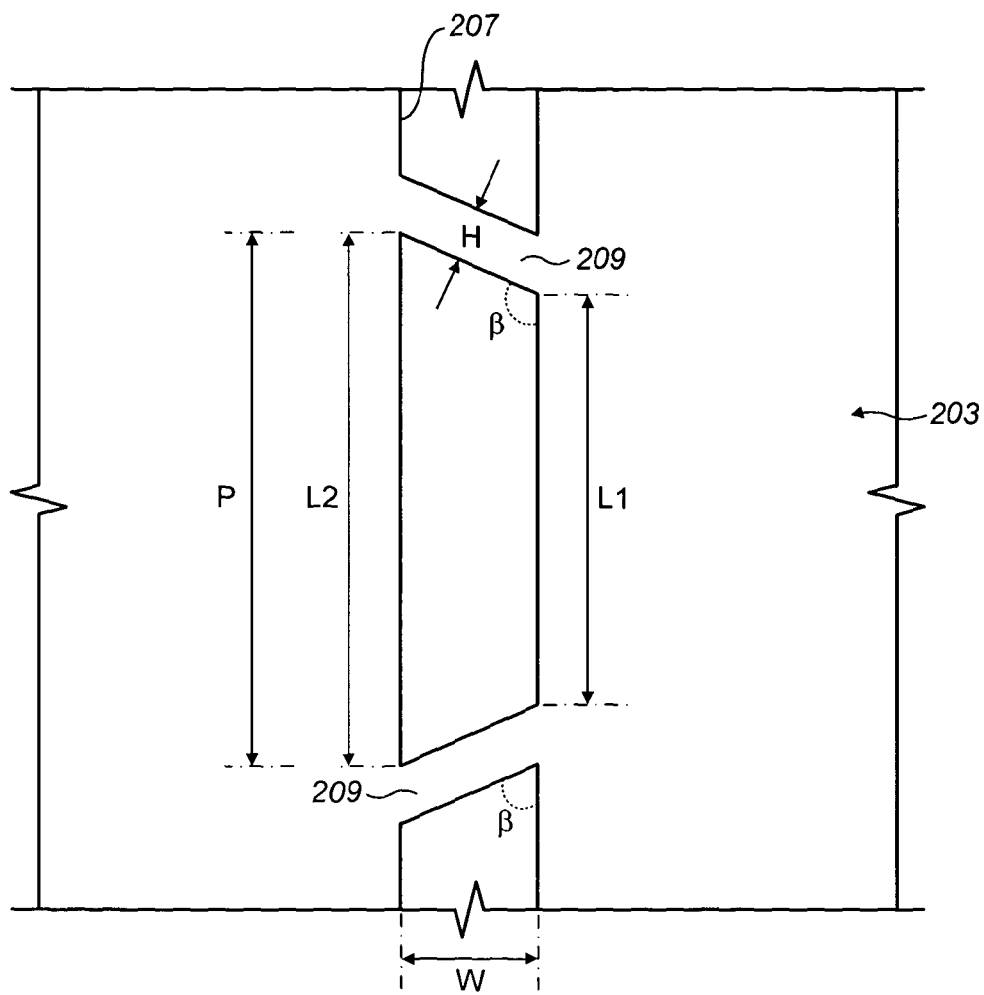
FIG. 18 illustrates a plan view of the stencil of FIG. 14.

In this embodiment, as illustrated clearly in FIG. 18, the bridges 209 are inclined alternately relative to the longitudinal axis of the respective printing aperture 207, such as alternately to enclose repeating acute and obtuse angles $\beta$ with respect to the longitudinal axis.

In this embodiment the bridges 209 are alternately inclined at an angle $\beta$ of about 15 degrees relative to the longitudinal axis of the respective printing aperture 207, thus alternately having angles $\beta$ of 75 and 105 degrees relative to the longitudinal axis.

In preferred embodiments the bridges 209 are alternately inclined at an angle $\beta$ up to about 30 degrees relative to the longitudinal axis of the respective printing aperture 207, preferably alternately inclined between about 5 degrees and about 30 degrees, more preferably alternately inclined between about 10 degrees and about 20 degrees.

The bridges 209 act to maintain the integrity of the first layer 203, and in particular the spacing between opposite edges of the respective printing apertures 207, when the stencil is under tension and during movement of a printing element thereover.

In this embodiment the printing apertures 207 have a width W of about 45+/−5 μm, a length L1 along the short side thereof of about 363.5+/−5 μm, and a length L2 along the long side thereof of about 460+/−5 μm.

In this embodiment the bridges 209 have a width H (across the length thereof) of about 35+/−5 μm and a mean pitch P (in the lengthwise direction of the printing aperture 207) of about 450 μm.

In a preferred embodiment the bridges 209 have a width H of from about 10 μm to about 60 μm, preferably from about 20 μm to about 50 μm, more preferably from about 20 μm to about 40 μm, and still more preferably from about 20 μm to about 30 μm or from about 30 μm to about 40 μm.

In a preferred embodiment the bridges 209 have a pitch P of at least about 150 μm, preferably at least about 250 μm, more preferably at least about 400 μm, still more preferably at least about 450 μm, and yet still more preferably at least about 500 μm.

In one embodiment the lower surface of the first layer 203 could be treated, such as to have a surface roughness, in order to promote bonding of the first and second layers 203, 205.

In another embodiment the lower surface of the first layer 203 could be provided with an intermediate bondcoat, in order to promote bonding of the first and second layers 203, 205.

In still another embodiment the first layer 203 could include keying apertures, typically arranged in rows parallel to the printing apertures 207, to which the material of the second layer 205 keys.

The second layer 205 includes a plurality of printing apertures 215, here narrow, elongate apertures, through which printing medium is printed onto the underlying substrate S, each located in registration with the printing apertures 207 in the first layer 203.

In this embodiment the printing apertures 215 in the second layer 205 have a width C which is greater than the width W of the printing apertures 207 in the first layer 203, whereby the printing apertures 215 define the width of the elongate structures to be deposited on the substrate S.

In this embodiment the second layer 205 defines completely the contact surface with the printing medium at the surface of the substrate S, and thereby defines the pattern of deposits to be printed.

In this embodiment the printing apertures 215 have substantially vertical sidewalls.

In this embodiment the printing apertures 215 have a width C of about 60+/−5 μm.

In preferred embodiments the printing apertures 215 have a width C of less than about 150 μm, preferably less than about 100 μm, more preferably less than about 75 μm, still more preferably less than about 60 μm, yet more preferably less than about 50 μm, and even more preferably less than about 30 μm.

In this embodiment the difference in the width W of the printing aperture 207 in the first layer 203 and the printing aperture 215 in the second layer 205 is about 15 μm.

In preferred embodiments the difference in the width W of the printing aperture 207 in the first layer 203 and the printing aperture 215 in the second layer 205 is from about 7.5 μm to about 30 μm, preferably from about 10 μm to about 30 μm, more preferably from about 10 μm to about 20 μm.

With this configuration, the requirement for precise alignment of the imaging equipment in forming the printing apertures 215 is reduced, as the greater width of the printing apertures 215 as compared to the printing apertures 207 in the first layer 203 provides for tolerance in the position at which the printing apertures 215 can be formed relative to the printing apertures 207 in the first layer 203. This compares to configurations where edges of printing apertures have to be aligned exactly.

In this embodiment the printing apertures 215 have an open area of about 95%. The present invention advantageously provides a much greater open area than compared to conventional mesh screens, which typically have an open area of less than 65%.

In a preferred embodiment the printing apertures 215 have an open area of at least about 80%, preferably at least about 90% and more preferably at least about 95%.

In this embodiment the first layer 203 and the second layer 205 each have a thickness T1 of about 30+/−2 μm.

In one embodiment the thickness T1 of the first layer 203 is not less than the thickness T1 of the second layer 205.

In this embodiment the stencil has a thickness T2 of about 60+/−5 μm.

In preferred embodiments the stencil has a thickness T2 of not more than about 80 μm, preferably not more than about 70 μm, more preferably not more than about 60 μm, still more preferably not more than about 50 μm, yet more preferably not more than about 40 μm, and still yet more preferably not more than about 30 μm.

In this embodiment the ratio of the thickness T1 of the first layer 203 to the thickness T1 of the second layer 205 is about 1:1.

In preferred embodiments the ratio of the thickness T1 of the first layer 203 to the thickness T1 of the second layer 205 is from about 0.8:1 to about 1:0.8, preferably from about 0.9:1 to about 1:0.9.

In this embodiment the ratio of the thickness T2 of the stencil to the width C of the printing apertures 215 is about 1:1.

In preferred embodiments the ratio of the thickness T2 of the stencil to the width C of the printing apertures 215 is from about 0.8:1 to about 1:0.8, preferably from about 0.9:1 to about 1:0.9, preferably greater than 1:1, preferably greater than 1:0.9, preferably greater than 1:0.8.

Finally, it will be understood that the present invention has been described in its preferred embodiments and can be modified in many different ways without departing from the scope of the invention as defined by the appended claims.

For example, in the above-described embodiments the first layer 3, 103, 203 could be formed of a non-metallic material instead of a metallic material, such as a synthetic or plastics material.

In addition, in the above-described embodiments the second layer 5, 105, 205 could be formed of a metallic material instead of a non-metallic material. In one embodiment the second layer 5, 105, 205 could be formed by electroforming, such as nickel electroforming.

The invention claimed is:

1. A printing screen for printing elongate structures on substrates, the printing screen comprising first and second layers, the first layer being formed of a metallic material and providing a surface over which a printing element is in use traversed and including a plurality of elongate first printing apertures across each of which extend a plurality of bridges at spaced intervals, and the second layer in use overlying a substrate and including a plurality of elongate second printing apertures through which printing medium is in use printed onto the underlying substrate, each of the second printing apertures being located in registration with respective ones of the first printing apertures in the first layer, wherein the bridges have a pitch of at least about 150 μm and the second printing apertures have a width of less than about 150 μm and an open area of at least about 80%.

2. The printing screen of claim 1, wherein the first layer is:
   (a) a metal layer or an electroformed metal or nickel layer; or
   (b) a metal or spring steel sheet.

3. The printing screen of claim 1, wherein the first printing apertures are formed in the first layer prior to application of the second layer thereto.

4. The printing screen of claim 1, wherein the second layer is a photo-imageable layer.

5. The printing screen of claim 1, wherein the second layer is formed of a screen emulsion or resist.

6. The printing screen of claim 5, wherein the second layer is applied as a wet, liquid film or formed by application of one or more wet, liquid films to the first layer, to one or both sides of the first layer.

7. The printing screen of claim 5, wherein the second layer is formed as a dry film.

8. The printing screen of claim 1, wherein the first printing apertures have a width of at least about 50 μm.

9. The printing screen of claim 1, wherein the first printing apertures have a width of at most 100 μm.

10. The printing screen of claim 1, wherein the bridges have a width of from about 10 μm to about 60 μm.

11. The printing screen of claim 1, wherein the bridges have a pitch of at least about 250 μm.

12. The printing screen of claim 1, wherein the second printing apertures have a width which is smaller than a width of the first printing apertures, whereby the second printing apertures define the pattern of the elongate structures to be printed at the surface of the substrate.

13. The printing screen of claim 12, wherein the second printing apertures have a width of less than about 100 μm.

14. The printing screen of claim 12, wherein the second printing apertures have a width of at least about 100 μm less than the width of the respective first printing apertures.

15. The printing screen of claim 1, wherein the second printing apertures have substantially vertical sidewalls.

16. The printing screen of claim 1, wherein the second printing apertures have an open area of at least about 90%.

17. The printing screen of claim 1, wherein the thickness of a main body of the first layer is not less than the thickness of a main body of the second layer.

18. The printing screen of claim 1, wherein the printing screen has a thickness of not more than about 80 μm.

19. The printing screen of claim 1, wherein the second layer is formed of a metallic material.

20. The printing screen of claim 1, wherein the substrate is a silicon solar cell and the elongate structures are metallization lines.

21. The printing screen of claim 1, wherein the second layer is formed of a non-metallic material.

22. A printing screen for printing elongate structures on substrates, the printing screen comprising first and second layers, the first layer being formed of a metallic material and providing a surface over which a printing element is in use traversed and including a plurality of elongate first printing apertures across each of which extend a plurality of bridges at spaced intervals, and the second layer in use overlying a substrate and including a plurality of elongate second printing apertures through which printing medium is in use printed onto the underlying substrate, each of the second printing apertures being located in registration with respective ones of the first printing apertures in the first layer, wherein the second layer extends into the first printing apertures in the first layer and defines the pattern of the elongate structures to be printed at the surface of the substrate and the second printing apertures have a width of less than about 150 μm and an open area of at least about 80%.

23. A printing screen for printing elongate structures on substrates, the printing screen comprising first and second layers, the first layer being formed of a metallic material and providing a surface over which a printing element is in use traversed and including a plurality of elongate first printing apertures across each of which extend a plurality of bridges at spaced intervals, and the second layer in use overlying a substrate and including a plurality of elongate second printing apertures through which printing medium is in use printed onto the underlying substrate, each of the second printing apertures being located in registration with respective ones of the first printing apertures in the first layer, wherein the second layer extends into the first printing apertures in the first layer and defines the pattern of the elongate structures to be printed at the surface of the substrate, wherein the second layer extends to the upper surface of the first layer at the first printing apertures therein, whereby the second printing apertures in the second layer extend a full height of the printing screen.

* * * * *